(12) United States Patent
Gabl et al.

(10) Patent No.: US 8,441,175 B2
(45) Date of Patent: May 14, 2013

(54) PIEZOACTUATOR HAVING ELECTRICAL CONTACT

(75) Inventors: Reinhard Gabl, St. Peter (AT); Jan-Thorsten Reszat, Karlsruhe (DE); Markus Laussermayer, Wettmannstaetten (AU)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/351,348

(22) Filed: Jan. 17, 2012

(65) Prior Publication Data

US 2012/0202382 A1   Aug. 9, 2012

Related U.S. Application Data

(63) Continuation of application No. PCT/EP2010/060491, filed on Jul. 20, 2010.

(30) Foreign Application Priority Data

Jul. 21, 2009  (DE) .......................... 10 2009 034 099

(51) Int. Cl.
*H01L 41/083* (2006.01)
*H01R 13/66* (2006.01)

(52) U.S. Cl.
USPC ....................... 310/366; 310/328; 439/620.24

(58) Field of Classification Search .................. 310/328, 310/366
See application file for complete search history.

(56) References Cited

U.S. PATENT DOCUMENTS

| | | | | |
|---|---|---|---|---|
| RE27,116 E | * | 4/1971 | Miller et al. .................. | 310/359 |
| 4,780,639 A | * | 10/1988 | Shirasu ......................... | 310/328 |
| 5,438,232 A | * | 8/1995 | Inoue et al. .................... | 310/328 |
| 6,474,565 B1 | | 11/2002 | Ruehle et al. | |
| 6,528,927 B1 | * | 3/2003 | Schuh et al. .................. | 310/328 |
| 7,564,169 B2 | | 7/2009 | Döllgast et al. | |
| 7,612,487 B2 | | 11/2009 | Döllgast et al. | |
| 8,049,397 B2 | * | 11/2011 | Kato .............................. | 310/366 |
| 2002/0158552 A1 | * | 10/2002 | Nakamura et al. ............. | 310/328 |
| 2004/0051423 A1 | * | 3/2004 | Florian ......................... | 310/328 |
| 2004/0169438 A1 | * | 9/2004 | Cramer et al. ................ | 310/328 |
| 2006/0181178 A1 | * | 8/2006 | Kastl et al. .................... | 310/328 |
| 2007/0040480 A1 | * | 2/2007 | Schurz et al. ................. | 310/366 |

FOREIGN PATENT DOCUMENTS

| | | |
|---|---|---|
| DE | 197 15 487 A1 | 10/1998 |
| DE | 199 28 180 A1 | 1/2001 |
| DE | 199 32 760 A1 | 1/2001 |
| DE | 199 45 933 C1 | 5/2001 |
| DE | 10 2005 039 911 A1 | 3/2007 |
| DE | 10 2006 032 743 A1 | 1/2008 |
| EP | 1 079 097 A2 | 2/2001 |
| EP | 1 257 006 A1 | 11/2002 |
| WO | WO 2005/035971 A1 | 4/2005 |
| WO | WO 2005/047689 A1 | 5/2005 |

* cited by examiner

*Primary Examiner* — Thomas Dougherty
(74) *Attorney, Agent, or Firm* — Slater & Matsil, L.L.P.

(57) ABSTRACT

A piezoactuator has multilayer construction. Piezoelectric layers and electrode layers are alternatingly disposed one over the other in a stack. A number of the electrode layers are electrically conductively connected to a contact pin. A continuation is electrically conductively disposed on the contact pin. The continuation has a contact point with the contact pin and a free end for producing an electrical connection of the piezoactuator. A straight line extending through the contact point and the free end of the continuation encloses an angle with the longitudinal axis of the contact pin that is greater than 0° and less than 180°.

16 Claims, 3 Drawing Sheets

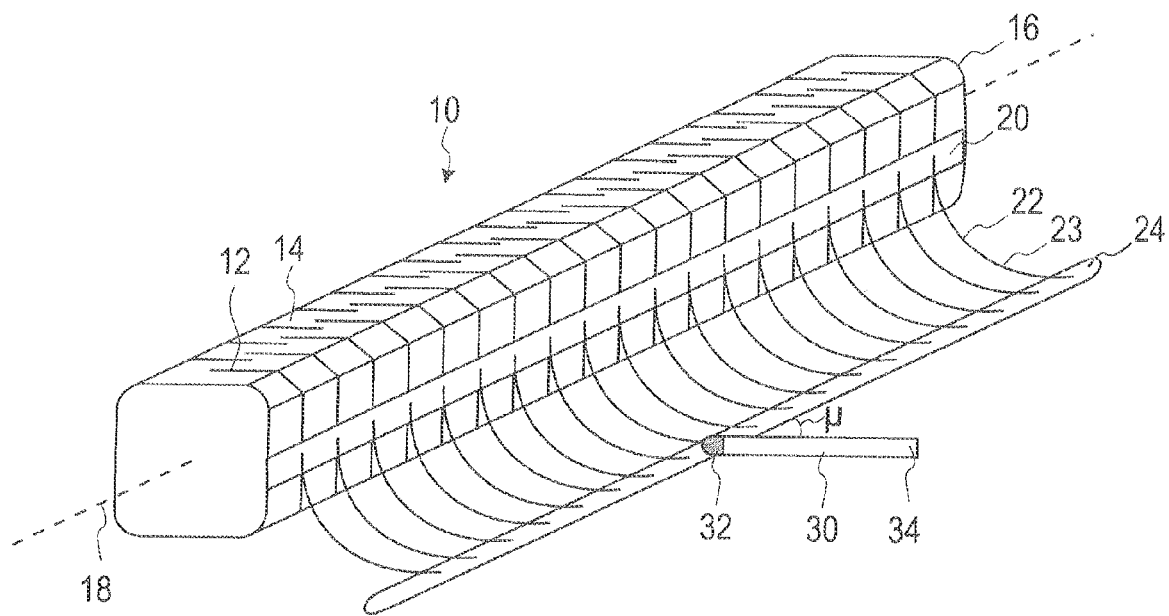

PIEZOACTUATOR HAVING ELECTRICAL CONTACT

This application is a continuation of co-pending International Application No. PCT/EP2010/060491, filed Jul. 20, 2010, which designated the United States and was not published in English, and which claims priority to German Application No. 10 2009 034 099.8, filed Jul. 21, 2009, both of which applications are incorporated herein by reference.

TECHNICAL FIELD

The invention relates generally to electronic devices and, in particular embodiments, to a piezoactuator having electrical contact.

By means of such a piezoactuator, by way of example, a valve piston of a control valve is actuated, which serves as an injection valve in a motor vehicle.

BACKGROUND

A piezoactuator is described, for example, in the German patent DE 199 45 933 C1 or International publication WO 2005/035971 A1.

SUMMARY OF THE INVENTION

In one aspect, a piezoactuator is specified which has high reliability and is suitable for a multiplicity of possible areas of application and installation locations.

A piezoactuator of multilayer design is described, wherein piezoelectric layers and electrode layers are arranged alternately one above another to form a stack. When an electrical voltage is applied to the electrode layers, the stack expands along the electric field direction resulting from the applied voltage.

A piezoactuator of multilayer design is specified, wherein piezoelectric layers and electrode layers are arranged alternately one above another to form a stack. The stack has, for example, four side faces and two end faces. The piezoactuator can be clamped at the end faces, which provides for a mechanical prestress along the longitudinal axis of the stack.

By way of example, the stack comprises a multiplicity of thin films composed of piezoceramic, which may comprise a material such as lead zirconate titanate. A piezoelectric layer can have one or a plurality of these films. Electrode layers are arranged between these layers composed of piezoceramic. Depending on the desired voltage-dependent behavior of the piezoactuator, an electrode layer need not necessarily follow every piezoelectric layer.

One possible material for the electrode layer is silver-palladium or copper. This can be applied as a paste to the piezoelectric layer by means of a screen printing method, and the stack can subsequently be sintered.

The electrode layers can be applied to the piezoelectric layers continuously or they can only partly cover the cross-sectional area of the piezoelectric layers. The embodiment of the electrical contact-connection of the electrode layers is dependent on whether the electrode layers are arranged continuously on the surface of the piezoelectric layers.

A plurality of electrode layers are electrically conductively connected to one contact pin. A continuation can be arranged at the contact pin such that it electrically conductively connects the contact pin and the continuation. In particular, the continuation has a contact point with the contact pin. The contact point is designed to electrically conductively connect the continuation to the contact pin. The continuation has a free end provided for establishing an electrical connection. A straight line running through the contact point and the free end of the continuation encloses an angle with the longitudinal axis of the contact pin that is greater than 0° and less than 180°.

In one embodiment, the contact point for establishing the connection between the continuation and the contact pin is arranged along the stack composed of piezoelectric layers and electrode layers. In particular, the contact point is arranged between an upper end and a lower end of the stack.

In an embodiment in which the electrode layers are designed continuously, the applied electrode layers lead out from the stack at all side faces thereof. The electrical connection of the electrode layers to the contact pin can be realized, for example, by means of thin wires that individually connect every second electrode layer at a side face of the stack to the contact pin.

A continuation can be fitted to the contact pin. The continuation is electrically conductively connected to the contact pin at the position of a contact point. By way of example, the continuation is fixedly connected to the contact pin, for example, soldered to the latter or fixed to the contact pin by means of an eye fixedly enclosing the contact pin.

All other fixing possibilities which enable a conductive contact between the contact pin and the continuation and which afford sufficient stability with regard to an electrical connection are likewise conceivable, however.

The continuation comprises, for example, a flexible line wire. Preferably, the continuation comprises a rigid pin-type element. A combination of these two possibilities would likewise be conceivable.

The continuation is fitted to the contact pin. The angle at which the continuation is fitted to the contact pin is intended to be between 0° and 180° with respect to the longitudinal axis of the contact pin. By virtue of the possibility of choosing different angles, an individual orientation of the electrical connections can be achieved and a lateral further contact-connection of the stack via the continuation is enabled.

The free end of the continuation can be oriented in a manner pointing outward as seen from the center of the stack. This free end can serve for applying a voltage between the electrode layers and thus, can form an electrical connection of the stack.

Preferably, the electrode layers lead out from the stack alternately at opposite side faces, and a plurality of electrode layers are contact-connected by means of an external electrode fitted laterally to the stack.

In a stack in which the electrode layers lead out from it in an alternating fashion, the electrode layers do not cover the entire area of a piezoelectric layer. The regions of the stack in which adjacent electrode layers do not overlap in the stacking direction are called inactive zones. The regions of the stack in which adjacent electrode layers overlap in the stacking direction are called active zones.

Such a construction of the stack allows, for example, all electrode layers which lead out from the stack at the same side to be jointly electrically contact-connected via a common external electrode.

The external electrode is produced, for example, by means of a firing paste applied to the outer side of the stack by a screen printing method, and is subsequently sintered with the stack.

In one advantageous embodiment, the contact pin is arranged parallel to the longitudinal axis of the stack.

Since the continuation is fixed to the contact pin, a fixed orientation of the contact pin with respect to the stack also implies a fixed orientation of the continuation with respect to the stack. In particular, the angle between the contact pin and the continuation is fixed in this case. This can be very useful in order to set up the position of the free end of the continuation and thus the later electrical connection of the piezoactuator, since only the angle of the continuation with respect to the contact pin has to be taken into account, and not the angle between the continuation and the longitudinal axis of the stack.

During the production of the piezoactuator, the contact pin may also have already been prefabricated with a continuation and the resultant component can be fitted to the stack by means of an intermediate element, for example, in a single work step. By virtue of the fact that the orientation of the continuation with respect to the contact pin is already fixed, the orientation of the continuation with respect to the stack is defined in the case of a parallel arrangement between contact pin and stack as well.

Moreover, a parallel orientation of the contact pin with respect to the stack saves space.

In a further advantageous embodiment, an electrically conductive intermediate element is arranged between the external electrode and the contact pin, the intermediate element electrically conductively connecting the external electrode and the contact pin.

The intermediate element can comprise one or a plurality of individual elements. By way of example, it can be an elastic component which adapts to the movements of the stack. This prevents a loss of electrical connection between the external electrode and the contact pin and provides for a stable operating capability of the piezoactuator. In particular, it is possible to prevent the tearing away of the connection between contact pin and intermediate element and between intermediate element and external electrode.

Such tearing away of the electrical connection between the contact pin and the electrode layers could result in failure of the piezoactuator. Should the piezoactuator actuate, for example, a valve piston of a control valve serving as an injection valve in a motor vehicle, then the piezoactuator has to be exchanged immediately in order to ensure further operation of the injection valve and thus of the engine.

Furthermore, it can be provided that the electrically conductive intermediate element comprises wires arranged parallel and which electrically conductively connect the external electrode to the contact pin. By way of example, the parallel wires can be oriented perpendicularly to the longitudinal axis of the stack. In order to electrically conductively connect the external electrode to the contact pin, for example a so-called wire harp is used. The latter comprises a plurality of thin, electrically conductive wires. The wire can be soldered to the external electrode and the contact pin.

By way of example, two external electrodes can be fitted to the stack. These external electrodes make contact with the electrode layers alternately. In order to produce the wire harp, a thin, electrically conductive wire is wound around the stack in a multiplicity of turns. After the wire has been soldered to the external electrodes, the wire connection between the two external electrodes can be severed and the connection can be completely removed. Consequently, the external electrodes are electrically insulated from one another.

Preferably, the straight line running through the contact point between the continuation and the contact pin and the free end of the continuation encloses an angle of 90° with the longitudinal axis of the contact pin.

The continuation can be arranged perpendicularly to the contact pin. If the contact pin is also arranged parallel to the longitudinal axis of the stack then the continuation is arranged not only perpendicularly to the contact pin but also perpendicularly to the longitudinal axis of the stack. This orientation is advantageous for a connection of the piezoactuator to a voltage source, since a lateral electrical further contact-connection of the piezoactuator is also possible in this way.

In one advantageous embodiment, the piezoactuator has a housing.

By way of example, the housing can be a potting composed of an elastic material such as silicone, or comprise a potting of this type. Ideally, the housing encloses at least the side faces of the stack. All other housing forms which do not impede operation of the piezoactuator are also conceivable. A housing can provide protection against environmental influences such as moisture, for example.

In a further advantageous embodiment, the contact pin is completely enclosed by the housing.

Since the contact pin is no longer required directly for connecting the stack to a voltage source, it can be expedient to leave the contact pin completely in the housing. A lateral connection is advantageous in some applications since the mechanical contact points situated at the end sides of the stack, for example, are separated from the electrical connections.

Preferably, the continuation projects from a side face of the housing.

An electrical further contact-connection at a side face of the housing is made possible in this way.

Furthermore, it can be provided that the continuation is connected to a connection element at a free end, and the piezoactuator can be driven via this connection element.

The connection element serves for applying an electrical voltage between the electrode layers. The behavior of the stack can be regulated by way of the magnitude of the applied voltage. The connection element can be an attachment onto the continuation. Such an attachment can be applied to each continuation. It is also possible for two attachments to be integrated in a component and to jointly form a connection element.

The connection element can also be a part of an electrical further contact-connection arranged at the installation location of the piezoactuator. The continuations can be connected to the further contact-connection via a plug connection, for example. Via the further contact-connection, a voltage can be applied to the stack and also regulated.

In one advantageous embodiment, the piezoactuator has two contact pins, and the electrode layers are electrically conductively connected alternately to a respective contact pin. Each of the contact pins has a continuation. Via the free ends of the continuations, a voltage can be applied between adjacent electrode layers.

By way of example, the electrode layers are connected to a contact pin alternately at opposite side faces of the stack. A continuation is fitted to the contact pin.

In the case of continuous electrode layers, every second electrode layer can be connected to a contact pin by means of a conductive wire. Since a continuation is fitted to the contact pin, an electrically conductive connection between the electrode layers and the continuation is established in this way.

Another possibility would be to establish a conductive connection between the electrode layers and the continuation via an external electrode and an intermediate element. This is advantageous particularly for the case where the electrode layers do not cover the entire cross-sectional area of the piezoelectric layer.

A voltage can then be applied to the continuations via the connection element. Depending on the desired embodiment of the connection, the continuation can be oriented in different ways with respect to the longitudinal axis of the stack.

In the case of two continuations, the further contact-connection can be effected with any desired orientation of the continuations with respect to one another. As a result, the piezoactuator can be manufactured individually, depending on what orientation of the free ends of the continuations is desired.

By way of example, the free ends of the continuations can be arranged at the same side face of the piezoactuator.

Such an arrangement of the free ends of the continuations is very space-saving, for example. In this case, an electrical further contact-connection is also necessary via only one side face. This is often preferred for space reasons and the installation of such a piezoactuator is, under certain circumstances, easier than in the case of an arrangement of the continuations at different side faces.

The free ends of the continuations can be arranged one above another with respect to the longitudinal axis of the stack. In this case, the free ends of the continuations can be arranged at different levels of the stack on the same side face of the piezoactuator or else at different side faces.

In a further embodiment, the free ends of the continuation are arranged alongside one another with respect to the longitudinal axis of the stack.

The free ends of the continuations can be arranged at the same level at the same side face of the piezoactuator or at the same level at different side faces of the piezoactuator.

In one advantageous embodiment, the free ends of the continuations are arranged at different side faces of the piezoactuator.

Such an arrangement of the free ends of the continuations has the advantage that the further contact-connection can be effected spatially separate from one another.

BRIEF DESCRIPTION OF THE DRAWINGS

The piezoactuator specified and its preferred embodiments are explained below with reference to schematic figures which are not true to scale, in which:

FIG. 1 shows a piezoactuator with a contact pin which is connected to the electrode layers via an intermediate element and to which a continuation is fitted;

FIG. 3a shows a side view of the piezoactuator as shown in FIG. 2a;

DETAILED DESCRIPTION OF ILLUSTRATIVE EMBODIMENTS

Figure 2A:
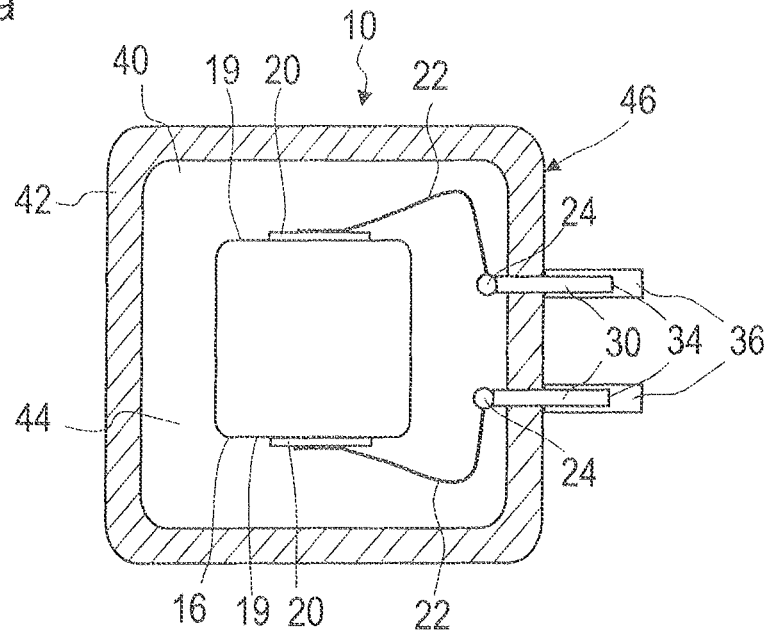
FIG. 2a shows a cross section through a piezoactuator with two continuations arranged perpendicularly to the longitudinal axis of the stack.

FIG. 1 schematically shows a piezoactuator 10. The electrode layers 12 are clearly discernible, the electrode layers leading from the stack 16 in an alternating manner in the embodiment illustrated here. An external electrode 20 is fitted to the opposite sides of the stack 16, only one external electrode 20 being visible in the view used here.

A conductive intermediate element 22 formed from thin conductive wires 23 is arranged at the external electrode 20. These wires 23 arranged parallel to one another connect the external electrode 20 to a rigid contact pin 24. A continuation 30 consisting of a metallic pin is fixedly soldered to said rigid contact pin 24. The contact pin 24 is arranged parallel to the longitudinal axis 18 of the stack 16.

The point at which the electrical contact between the continuation 30 and the contact pin 24 is produced is the contact point 32. The free end 34 of the continuation 30 points in a direction facing away from the stack 16.

If a straight line is placed through the contact point 32 and the free end 34 of the continuation 30, then the straight line encloses an angle µ with the longitudinal axis 18 of the contact pin 24 that is 90° in the example illustrated.

FIG. 2a shows a cross section perpendicular to the longitudinal axis 18 of a piezoactuator 10 with two continuations 30 arranged perpendicularly to the longitudinal axis 18 of the stack 16.

The stack 16 can be seen in the center of the illustration, a respective external electrode 20 being applied to the stack 16 at two mutually opposite side faces 19. These external electrodes 20 are conductively connected to a respective contact pin 24 via a bent intermediate element 22.

A continuation 30 is electrically conductively soldered to the contact pin 24. A potting compound 42 is injection-molded around this arrangement and, together with a sleeve 44, forms the housing 40 of the piezoactuator 10. The potting compound 42 can comprise an elastic material such as silicone, for example.

At the right-hand side of FIG. 2a it can be seen that only the two continuations 30 project from the housing 40. Connection contacts 36 are fitted to the free ends 34 of the continuations 30, via which connection contacts a voltage is applied to the electrode layers 12 in the piezoactuator 10. The continuations 30 project from the housing 40 at the same side face 46.

Figure 2B:
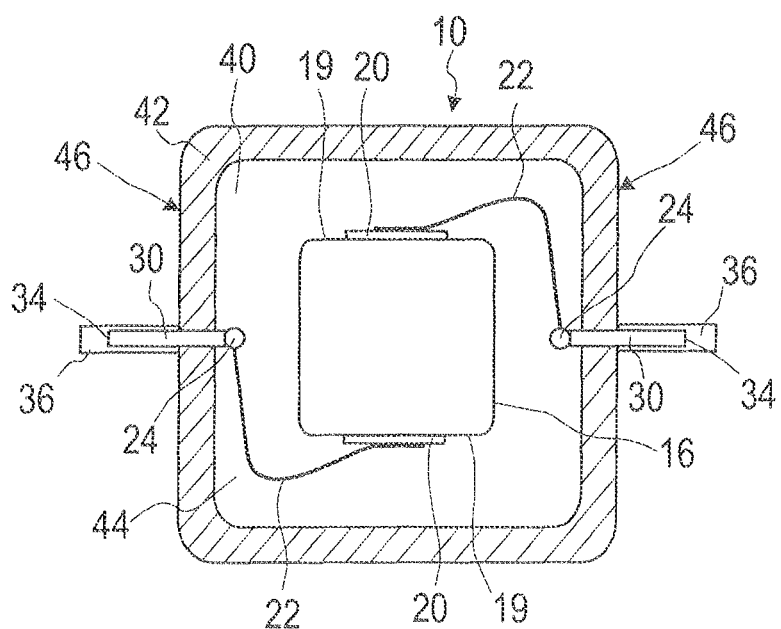
FIG. 2b shows a cross section through a piezoactuator with two continuations which are arranged at opposite sides of the stack.

FIG. 2b shows a similar construction to that in FIG. 2a with the difference that the continuations 30 project from the housing 40 at opposite side faces 46 of the housing.

Figure 3A:
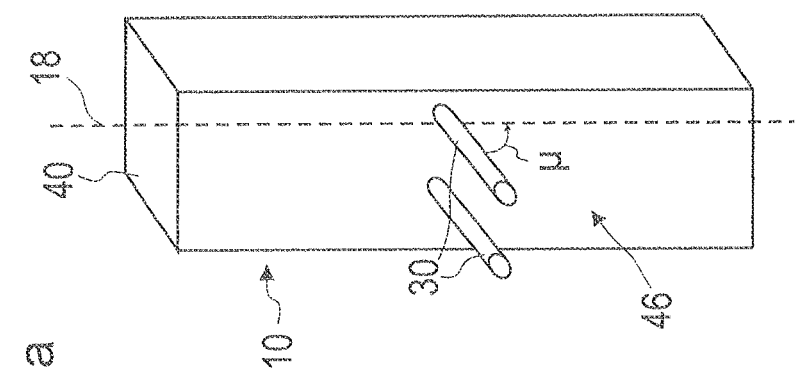

FIG. 3a shows a side view of the piezoactuator 10 as already shown in cross section in FIG. 2a. It can clearly be seen that the continuations 30 are arranged at the angle µ=90° with respect to the longitudinal axis 18 of the piezoactuator 10.

It can likewise be seen that the continuations 30 are arranged alongside one another perpendicularly to the longitudinal axis 18 of the piezoactuator 10.

Figure 3B:
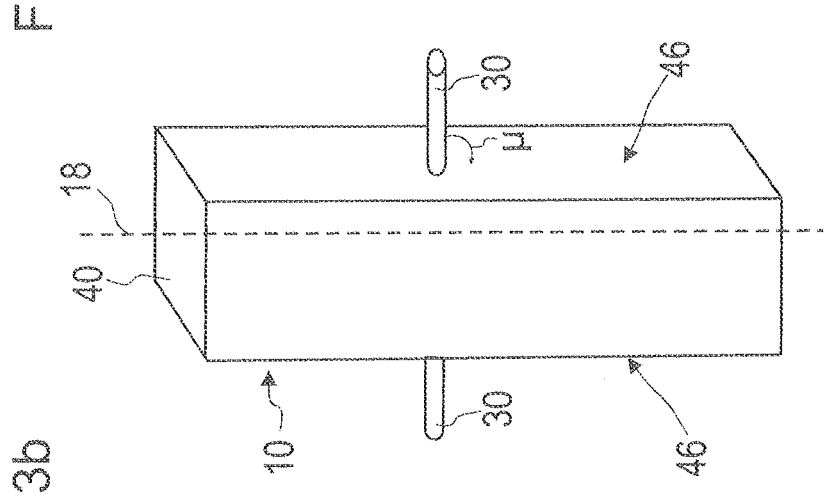
FIG. 3b shows a side view of the piezoactuator as shown in FIG. 2b.

FIG. 3b shows a side view of the piezoactuator 10 as already shown in cross section in FIG. 2b. It can clearly be seen that the continuations 30 are arranged at the angle µ=90° with respect to the longitudinal axis 18 of the piezoactuator 10.

It can likewise be seen that the continuations 30 lead out from the housing 40 of the piezoactuator 10 at the same level at opposite side faces 46 of the housing.

Figure 3C:
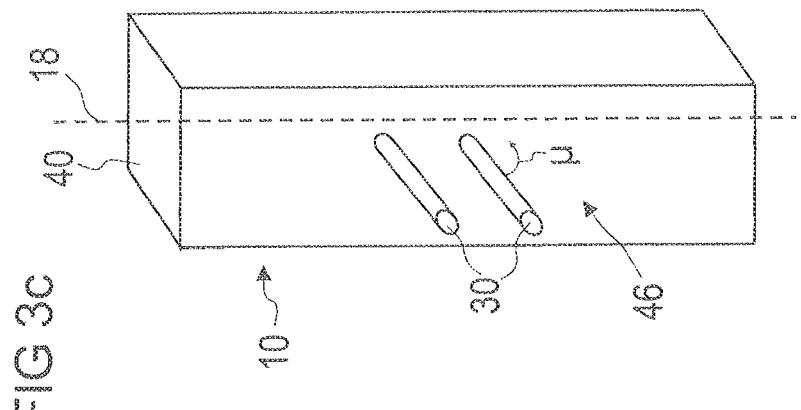
FIG. 3c shows a side view of a piezoactuator with two continuations arranged one above the other with respect to the longitudinal axis of the piezoactuator.

FIG. 3c shows a side view of a piezoactuator 10. In the same way as in FIG. 3a, the continuations 30 lead out from the housing 40 at the same side face 46 of the housing. In this example, however, they are arranged one above another perpendicularly along the longitudinal axis 18.

The invention is not restricted to the preferred exemplary embodiments described above. Rather, a large number of variations and modifications are possible which likewise make use of the concept of the invention and therefore fall within the scope of protection.

LIST OF REFERENCE SYMBOLS

10 Piezoactuator
12 Electrode layer
14 Piezoelectric layer
16 Stack
18 Longitudinal axis
19 Side face of the stack
20 External electrode
22 Intermediate element
23 Wire
24 Contact pin
30 Continuation
32 Contact point
34 Free end of the continuation
36 Connection element
40 Housing
42 Potting
44 Sleeve
46 Side face of the housing
μ Angle between a straight line which runs through the contact point and the free end of the continuation and the contact pin

What is claimed is:

1. A piezoactuator comprising:
    piezoelectric layers;
    electrode layers wherein the piezoelectric layers and the electrode layers are arranged alternately one above another to form a stack;
    a contact pin, wherein a plurality of the electrode layers are electrically conductively connected to the contact pin;
    a continuation arranged at the contact pin, the continuation having a contact point for establishing an electrically conductive connection to the contact pin, the continuation also having a free end to allow an electrical connection to the piezoactuator, wherein a straight line running through the contact point and the free end of the continuation encloses an angle with a longitudinal axis of the contact pin that is greater than 0° and less than 180°.

2. The piezoactuator according to claim 1, wherein the electrode layers lead out from the stack alternately at opposite sides, and wherein a plurality of the electrode layers are contact-connected by an external electrode fitted laterally to the stack.

3. The piezoactuator according to claim 1, wherein the contact pin is arranged parallel to the longitudinal axis of the stack.

4. The piezoactuator according to claim 2, further comprising an electrically conductive intermediate element arranged between the external electrode and the contact pin, the intermediate element electrically conductively connecting the external electrode and the contact pin.

5. The piezoactuator according to claim 4, wherein the electrically conductive intermediate element comprises wires arranged parallel that electrically conductively connect the external electrode to the contact pin.

6. The piezoactuator according to claim 1, wherein the straight line running through the contact point between the continuation and the contact pin and the free end of the continuation encloses an angle of 90° with the longitudinal axis of the contact pin.

7. The piezoactuator according to claim 1, further comprising a housing.

8. The piezoactuator according to claim 7, wherein the contact pin is completely enclosed by the housing.

9. The piezoactuator according to claim 8, wherein the continuation projects from a side face of the housing.

10. The piezoactuator according to claim 1, wherein the continuation is connected to a connection element at the free end, and wherein the piezoactuator can be driven via the connection element.

11. The piezoactuator according to claim 1, wherein the piezoactuator has two contact pins, wherein the electrode layers are electrically conductively connected alternately to a respective one of the contact pins, wherein each of the contact pins has a continuation, and wherein, via the free ends of the continuations, a voltage can be applied between adjacent electrode layers of the stack.

12. The piezoactuator according to claim 11, wherein the free ends of the continuations are arranged at the same side face of the piezoactuator.

13. The piezoactuator according to claim 12, wherein the free ends of the continuations are arranged one above another with respect to the longitudinal axis of the stack.

14. The piezoactuator according to claim 12, wherein the free ends of the continuations are arranged alongside one another with respect to the longitudinal axis of the stack.

15. The piezoactuator according to claim 11, wherein the free ends of the continuations are arranged at different side faces of the piezoactuator.

16. The piezoactuator according to claim 15, wherein a single straight line runs through the contact points and free ends of both contact pins.

* * * * *

UNITED STATES PATENT AND TRADEMARK OFFICE
CERTIFICATE OF CORRECTION

| | | |
|---|---|---|
| PATENT NO. | : 8,441,175 B2 | Page 1 of 1 |
| APPLICATION NO. | : 13/351348 | |
| DATED | : May 14, 2013 | |
| INVENTOR(S) | : Gabl et al. | |

It is certified that error appears in the above-identified patent and that said Letters Patent is hereby corrected as shown below:

On the Title Page, Section (75) Inventors, 4th line, delete "Wettmannstaetten (AU)" and insert --Wettmannstaetten (AT)--.

Signed and Sealed this
Sixteenth Day of July, 2013

Teresa Stanek Rea
*Acting Director of the United States Patent and Trademark Office*